United States Patent
Shi

(10) Patent No.: US 11,372,396 B2
(45) Date of Patent: Jun. 28, 2022

(54) CONTROL PRODUCT FLOW OF SEMICONDUCTOR MANUFACTURE PROCESS UNDER TIME CONSTRAINTS

(71) Applicant: Weiping Shi, College Station, TX (US)

(72) Inventor: Weiping Shi, College Station, TX (US)

(*) Notice: Subject to any disclaimer, the term of this patent is extended or adjusted under 35 U.S.C. 154(b) by 307 days.

(21) Appl. No.: 16/760,342

(22) PCT Filed: Nov. 26, 2018

(86) PCT No.: PCT/US2018/062423
§ 371 (c)(1),
(2) Date: Apr. 29, 2020

(87) PCT Pub. No.: WO2019/104264
PCT Pub. Date: May 31, 2019

(65) Prior Publication Data
US 2021/0181726 A1    Jun. 17, 2021

Related U.S. Application Data

(60) Provisional application No. 62/590,878, filed on Nov. 27, 2017.

(51) Int. Cl.
*G05B 19/418* (2006.01)
*G06Q 10/06* (2012.01)

(52) U.S. Cl.
CPC ... *G05B 19/41885* (2013.01); *G05B 19/4183* (2013.01); *G05B 19/4189* (2013.01); *G05B 19/41835* (2013.01); *G06Q 10/0633* (2013.01); *G06Q 10/0639* (2013.01)

(58) Field of Classification Search
None
See application file for complete search history.

(56) References Cited

U.S. PATENT DOCUMENTS

| | | | | |
|---|---|---|---|---|
| 5,993,041 A * | 11/1999 | Toba | ............... | G05B 19/41865 700/99 |
| 6,647,307 B1 * | 11/2003 | Huang | ............... | G06Q 10/06 700/99 |
| 7,020,594 B1 | 3/2006 | Chacon | | |
| 7,257,454 B2 * | 8/2007 | Chien | ............... | G06Q 10/06 700/121 |

(Continued)

OTHER PUBLICATIONS

International Search Report & Written Opinion received in PCT/US2018/062423 dated Jan. 28, 2019, pp. 7.

*Primary Examiner* — Ryan D. Coyer
(74) *Attorney, Agent, or Firm* — Zhong Law, LLC

(57) ABSTRACT

A method and system relate to executing, by a processing device, a first simulation of operations of a semiconductor manufacture plant without imposing a Q-time constraint on a Q-zone, determining a kanban capacity value associated with the Q-zone based on results from the first simulation, executing a second simulation of operations of the semiconductor manufacture plant using the kanban capacity value under the Q-time constraint, determining whether results of the second simulation meet performance indices, and responsive to determining that the results of the second plant simulation meet the performance indices, providing the kanban capacity value to a manufacture execution system to operate the semiconductor manufacture plant using the kanban capacity value.

20 Claims, 4 Drawing Sheets

(56) References Cited

U.S. PATENT DOCUMENTS

| | | | |
|---|---|---|---|
| 7,499,766 B2 | 3/2009 | Knight et al. | |
| 8,805,564 B2* | 8/2014 | Fontanot | G05B 19/41865 700/99 |
| 2005/0055105 A1* | 3/2005 | Wu | G05B 19/41865 700/1 |
| 2007/0179652 A1 | 8/2007 | Weigang et al. | |
| 2015/0287621 A1* | 10/2015 | Xiao | G05B 19/4183 700/108 |
| 2017/0083008 A1* | 3/2017 | Wu | G05B 19/4187 |

* cited by examiner

CONTROL PRODUCT FLOW OF SEMICONDUCTOR MANUFACTURE PROCESS UNDER TIME CONSTRAINTS

RELATED APPLICATION

This application is the US national phase of International patent application NO. PCT/CN2018/062423, titled "CONTROL PRODUCT FLOW OF SEMICONDUCTOR MANUFACTURE PROCESS UNDER THE TIME CONSTRAINTS", filed Nov. 26, 2018, which claims priority to U.S. Provisional Application 62/590,878 filed Nov. 27, 2017, both of which are incorporated herein by reference in their entirety.

TECHNICAL FIELD

The present disclosure relates to a system and method to control the manufacture process of semiconductor products, in particular, to control the time requirements (referred to as the Q-times for Q-zones) in semiconductor manufacturing plants.

BACKGROUND

A plant may include different types of machines to perform a series of steps of a manufacturing process that produces the eventual products. For example, the manufacture process to fabricate semiconductor products may include the steps of wet clean, photolithography, ion implantation, dry etching, wet etching, plasma ashing, thermal treatments, chemical vapor deposition (CVD), physical vapor deposition (PVD), molecular beam epitaxy (MBE), electrochemical deposition (ECD), chemical-mechanical planarization (CMP), wafer testing, and wafer back grinding. Each of these steps (or sub-steps) may be performed once or repeatedly during the manufacture process. Each step may be performed by one or more semiconductor manufacture machines (or groups of machines), and each machine may participate in one or more than one steps. Thus, a piece of raw wafer may undergo the steps (and sub-steps) of the manufacture process to produce the eventual products (e.g., the ICs).

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
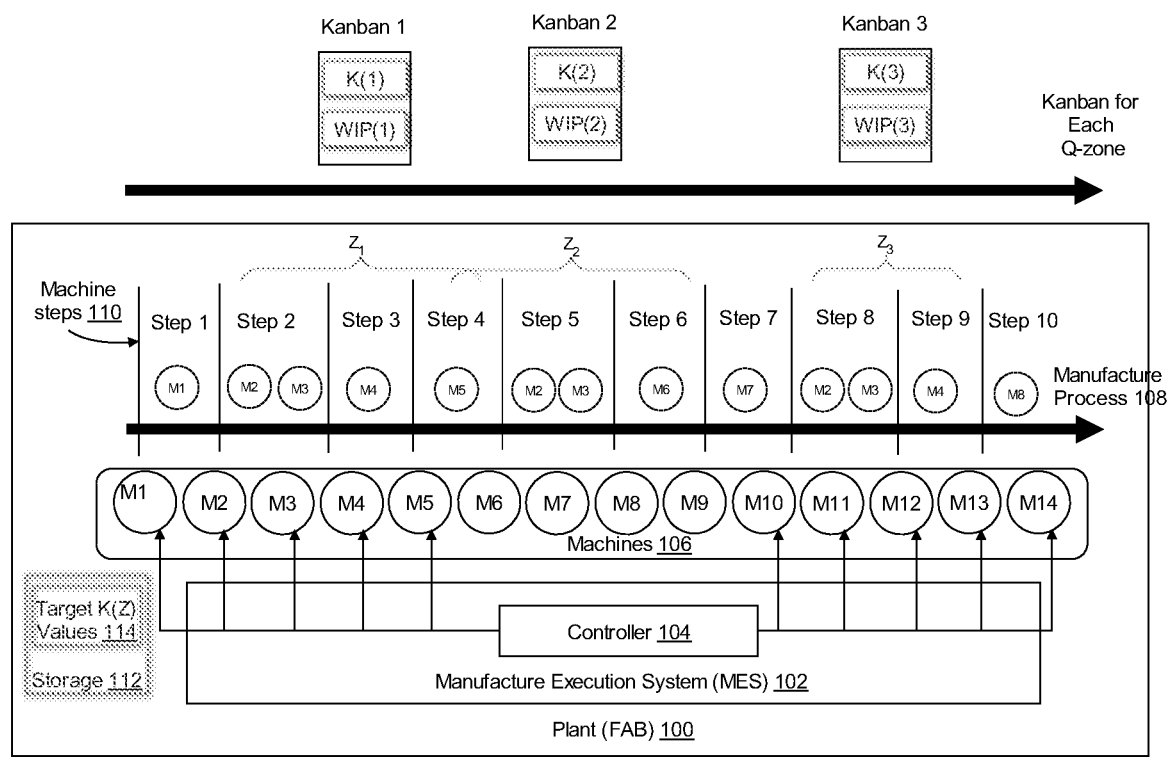
FIG. 1 illustrates a semiconductor manufacture plant according to an implementation of the present disclosure.

In one particular example, the plant may be a semiconductor manufacture plant (referred to as a FAB). The manufacture parts can be semiconductor wafers that undergo different manufacture steps to produce integrated circuits (ICs). These ICs can be the final products of the FAB. Normally, an apparatus may carry up to 25 semiconductors wafers that can be processed and transported together. The wafers in the apparatus are referred to as a wafer lot.

A semiconductor manufacture plant may concurrently utilize thousands of machines to produce hundreds of IC products through one or more manufacture processes. Each manufacture process may include hundreds of steps (or sub-steps) needed for fabricating these products. Different types of machines may be employed by different steps. A same type of machines can also be utilized to perform different steps in the manufacture process. Thus, the production capacity of a machine may be divided to meet the demands to perform different steps of the manufacture process, and the processing of each step may be carried out by a group of machines with varying capacity assigned to the step.

Each machine may have a certain capacity to process a certain number of wafers (or a certain number of wafer lots) associated with one or more manufacture steps for a duration of time (e.g., a day or a week). The manufacture process may employ a sequence of manufacture steps in which a wafer is processed. At each step, the machines (or the machine group) assigned to the step may receive wafers or wafer lots that had been processed by machines used by the previous step and may further produce the wafers for the next step. To maximize the capability of the semiconductor manufacture plant, it is desirable to have all machines of the semiconductor manufacture plant to run at or substantially close to their full capacities. To ensure that each machine of a step runs at its full capacity, a certain number of wafers (or wafer lots) should be available, waiting to be processed by the machine of that step. The number of wafers (or wafer lots) waiting to be processed is referred to as work-in-processes or WIP $(P_i, S_j)$, where $P_i$, $i=1, \ldots, N$ represents the $i^{th}$ product, and $S_j$, $j=1, \ldots, M$ represents the $j^{th}$ step in the manufacture process of product $P_i$, and N and M are integers greater than one.

The manufacture process may be associated with constraints to ensure the quality of the products. One type of constraints is a time constraint (e.g., a time limit) to perform the manufacture process or part of the manufacture process. This time constraint may require that certain consecutive steps (e.g., steps $S_J$ to $S_K$, inclusive) of a manufacturing process for producing a certain product $P_i$ be completed within a certain time period. These consecutive steps of a product as a whole are referred to as a Q-zone $Z(P_i, S_J, S_K)$ and the maximum time allowed to perform these steps in the Q-zone is referred to as a Q-time requirement $T(P_i, S_J, S_K)$ associated with the Q-zone. If a wafer of $P_i$ spends longer than Q-time $T(P_i, S_J, S_K)$ to complete steps $S_J$ to $S_K$, the wafer is deemed as defective or unreliable. The unreliable wafer may require additional tests (or processing) to determine whether the wafer is defective or not. As such, violations of the Q-time requirement $T(P_i, S_J, S_K)$ can cause a decrease of production rate due to defective wafers or an increase of production time due to the additional tests.

In some plants, the Q-zone may be defined as non-inclusive of the first step $S_J$ or the last step $S_K$. Under such a definition, the Q-zone may start after the completion of the first step until the start of the last step of the Q-zone. In general, this definition can be converted to the definition provided above by adding the processing time of the first step and the last step. For simplicity and convenience of discussion, the Q-zone is defined to include the first and last steps in this disclosure.

It is possible that two Q-zones share overlapping steps. For example, the last step of a front Q-zone can be the first step of a subsequent Q-zone. In some situations, a Q-zone can be an isolated Q-zone that may have no other Q-zones in front or at behind.

The Q-zones may also overlap or nest. In other words, in Q-zones $Z_1(P_i, S_J, S_K)$ and $Z_2(P_i, S_{J'}, S_{K'})$, the steps may form the following relations J<J'<K<K', or J<J'<K'<K. For example, one product may have steps 1 to 5 in the first Q-zone, steps 3 to 8 in the second Q-zone, and steps 6 to 10 in the third Q-zone. In another example, another product may have steps 1 to 8 in the first Q-zone, steps 4 to 6 in the second Q-zone, and steps 6 to 10 in the third Q-zone. The three Q-zones may each have its own respective but non-contradictive Q-time requirement.

Each step of a Q-zone can be performed by a machine or a group of machines. On the other hand, a machine or a group of machines may perform steps associated with multiple Q-zones. Two different Q-zones of the same product may be performed by the same machine or same group of machines.

Wafers being processed by machines associated with Q-zone Z and wafers waiting to be processed by machines associated with Q-zone Z are together referred to as work-in-processes (or WIP) of Q-zone Z that can be represented as WIP(Z). Wafers waiting before the first step of Q-zone Z are commonly excluded from the WIP(Z).

In a manufacture process, the WIP(Z) may be controlled using a scheduling system. A commonly used scheduling system is the kanban system. A kanban can be a physical card or an electronic data storage (an E-card) containing a data structure that records the level of WIP(Z) associated with the Q-zone(Z), referred to as a WIP level. The kanban system may maintain WIP information at different resolution levels. For example, in one implementation, the WIP information may be maintained for each product. In another implementation, the WIP may be maintained for a group of products or for all products. For convenience and simplicity of discussion, although the WIP information is discussed in terms of a particular product $P_i$, it is understood $P_i$ can also represent a group of products or all products. When $P_i$ represents a group of products, the steps of each product will be mapped to a common set of steps for the purpose of scheduling with the kanban system.

As the wafers having been processed and exiting from the Q-zone (Z), the WIP level associated with Q-zone(Z) may decrease. When the WIP level is lowered to a pre-determined threshold value (e.g., 10 lots or 20% of the original WIP level), the event may trigger a workflow requesting a supply of wafers from steps before Q-zone(Z). In addition to the WIP level in real time, the kanban system may also include a maximum WIP value. The maximum WIP value may indicate the maximum number of wafers that the Q-zone(Z) may hold. In this disclosure, the maximum WIP value associated with Q-zone(Z) is referred to as the kanban capacity value K(Z). K(Z) may be used to control the manufacture process. During the manufacturing process, if WIP(Z)≥K(Z) for Q-zone $Z(P_i, S_J, S_K)$, then no wafer of product $P_i$ is allowed to be supplied to Q-zone $Z(P_i, S_K)$ and start step $S_J$. Those wafers of product $P_i$ that have already been supplied to Q-zone $Z(P_i, S_J, S_K)$ may continue to be processed in Q-zone $Z(P_i, S_J, S_K)$. If WIP(Z)<K(Z), then wafers of $P_i$ may be supplied to Q-zone $Z(P_i, S_J, S_K)$ and start step $S_J$.

In some implementations, for any Q-zone $Z(P_i, S_J, S_K)$, the higher the kanban capacity value K(Z), the higher WIP(Z) or the more wafers waiting to be processed. In one implementation, the overall utilization rate of a plant is defined by the average utilization rate of all machines in the plant over a period of time, where the utilization rate of a machine is the ratio of the actual number of wafers processed by the machine over the number of wafers that could have been processed by the machine running at the full capacity. When there are fewer than sufficient numbers of wafers waiting to be processed at a step, the machines (or machine group) for this step do not have enough parts to process at their full utilization rates. A sufficient number of waiting wafers not only guarantees that the machines run full time, but also reduces the frequency of product changes which will incur additional time to adjust the machines. Thus, a higher kanban capacity value K(Z) may result in higher WIP(Z) which may lead to a higher overall utilization rate for Q-zone(Z).

However, higher kanban K(Z) may result in more wafers waiting to be processed by machines in Q-zone(Z), thus leading to a long waiting time for some wafers. The long waiting time may lead wafers to stay in the Q-zone(Z) longer than Q-time $T(P_1, S_J, S_K)$, which may cause more Q-time violations. In contrast, the lower the kanban capacity value K(Z), the lower WIP(Z), or in general, the shorter the waiting time for wafers to be processed, and thus fewer Q-time violations. However, lower kanban capacity value K(Z) may cause fewer wafers of $P_i$ processed, resulting a lower overall utilization of machines associated with Q-zone (Z).

Implementations of the disclosure provide a technical solution that computes, using a processing device (e.g., a hardware processor), a kanban capacity value for a Q-zone that allows maximizing the throughput and at the same time, minimizing the Q-time violation.

Different Q-zones may share the usage of some machines. For example, in Q-zones $Z_1(P_i, S_J, S_K)$ and $Z_2(P_i, S_{J'}, S_{K'})$, steps $S_K$ and $S_{K'}$ may use the same group of machines. As a result, a higher kanban capacity value $K(Z_1)$ may cause congestion at the machines for step $S_K$, which may cause longer waiting time for wafers in Q-zone $Z_2$. Implementations of the disclosure takes into consideration all Q-zones that share common machines when setting the kanban capacity values.

The processing device may execute an assignment program to assign Q-time allowance to each step, from overlapping Q-zones and Q-time requirements. The assignment program is applied repeatedly to each set of overlapping Q-zones. For each set of overlapping Q-zones of a product P, the assignment program may contain a linear programming (LP) solver to find the maximum possible value X subject to the following linear constraints: for each Q-zone $Z_i(P, S_J, S_K)$ with Q-time $Q_i$ in the set of overlapping Q-zones, the linear constraint is $X(T_J+T_{J+1}+\ldots+T_K) \leq Q_i$, where $T_J, \ldots, T_K$ are the estimated processing time, excluding waiting time, to process steps $S_J, \ldots, S_K$, respectively. The processing device may execute the LP solver to assign Q-times among the steps in a way that: 1) a step that needs more time to process is given more Q-time, 2) a step that needs less time to process is given less Q-time, and 3) the sum of Q-time assigned to steps in a Q-zone will not exceed the Q-time requirement of the Q-zone. In another implementation, the partition of Q-time may be performed by proportionally assigning Q-time to each step according to the processing time, without using LP. In another implementation, the partition of Q-time may be monotonical, but not necessarily linear.

Figure 4:
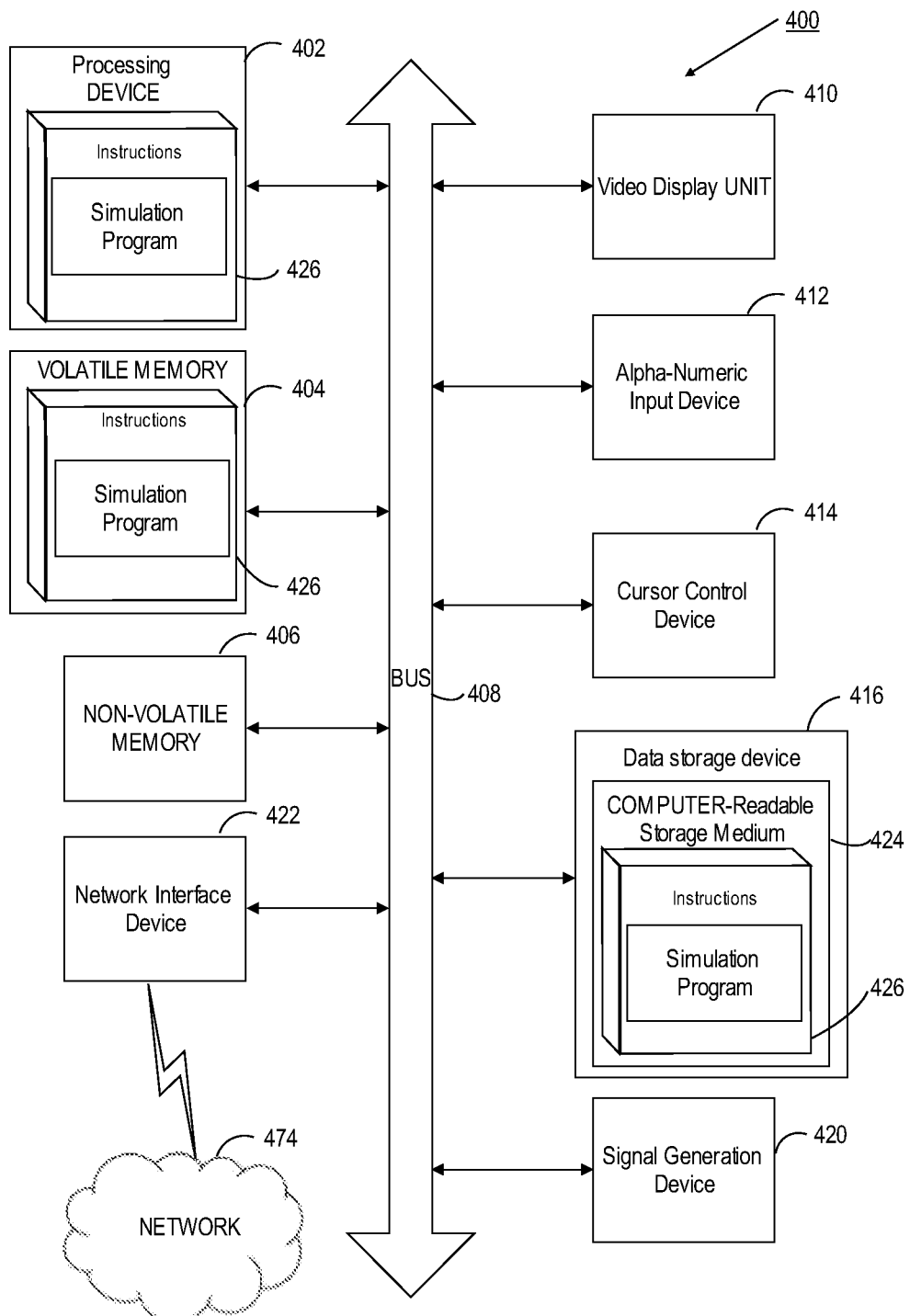
FIG. 4 depicts a block diagram of a computer system operating in accordance with one or more aspects of the present disclosure.

FIG. 1 illustrates a semiconductor manufacture plant 100 according to an implementation of the present disclosure. Plant 100 may include a manufacture execution system (MES) 102 that may control multiple machines 106 (e.g., M1-M14) using a controller 104. MES 102 may include a dispatcher system or a scheduling system that dispatches wafers or wafer lots to machines in a FAB. MES 102 can include a computer system (as shown in FIG. 4) including a processing device (e.g., a central processing unit (CPU)). MES 102 may also include a storage device 112 to store information associated with machines.

A manufacture process 108 may include a series of steps (Steps 1-10) 110, where some of the steps may for Q-zones ($Z_1$-$Z_3$). Each one of machines 106 may participate in performing one of more steps in the Q-zones (e.g., $Z_1$-$Z_3$) of manufacture process 108. Each Q-zone may require contributions from one or more machines 106. The combinations of machines assigned to a step may be referred to as a machine group. Different groups of machines may include different types of machines or may share same machines among several groups. As shown in FIG. 1, Q-zones $Z_1$, $Z_2$ and $Z_3$ may be associated with a first machine group including $M_2$ and $M_3$, where the group may contribute a portion of its capacity to each of Q-zones $Z_1$, $Z_2$ and $Z_3$. At each step, there is a corresponding number (WIP #) of wafers (or wafer lots) waiting to be processed. A wafer (or a wafer lot) after being processed at step may be supplied, as part of WIPs, to the following Q-zone.

The manufacture process 108 may include hundreds of Q-zones. Each Q-zone may include one to hundreds of steps (or sub-steps). The WIP for each Q-zone may be defined as the sum of WIPs for all of the steps in the Q-zone. Some of the Q-zones (e.g., $Z_1$ and $Z_2$) may include an overlapping step (e.g., Step 4). Some of the Q-zones (e.g., $Z_3$) may be isolated from other Q-zones.

In one implementation, the processing device of MES 102 may include a controller 104 to issue requests to machines 106. The requests may include information to control which machines and their corresponding capacities are assigned to a Q-zone, thus controlling the WIP of that Q-zone. The request may also include information to control which product steps or Q-zones the machine group needs to process, thus controlling the WIP of the steps or Q-zones related to the machine group. For example, the request to machine group {$M_2$, $M_3$} may simultaneously control the WIP of Q-zone $Z_1$, Q-zone $Z_2$, and Q-zone $Z_3$. In one implementation, controller 104 may include logic circuit that is programmed to issue these requests. In another implementation, controller 104 may be a software application executing on the processing device of MES 102.

As discussed above, each Q-zone Z may be associated with a WIP level value WIP(Z) and a kanban capacity value K(Z), where the WIP level may indicate the current number of WIPs in the Q-zone. The WIP level can be determined based on the number of WIPs supplied to the Q-zone and the number of WIPs that have been processed in the Q-zone and exited the Q-zone. The kanban capacity value may indicate the upper limit of WIPs in the Q-zone and may determine whether the Q-zone operates in an optimal state under which machines 106 are fully utilized without waiting for parts while Q-time violations for the parts are minimized.

In one implementation, a processing device may be programmed to run a simulation application to determine the optimal kanban capacity values associated with different Q-zones. An implementation of the simulation is described in conjunction with FIG. 3 discussed later. Once the simulation determines these optimal kanban capacity values through the simulation, the processing device may store these kanban capacity values in storage device 112 as K(Z) values 114.

In one implementation, controller 104 may use kanbans to control WIPs supplied to each Q-zone. Each Q-zone may be assigned with a corresponding kanban. For example, as shown in FIG. 1, Q-zones $Z_1$-$Z_3$ each may be assigned with a corresponding kanban 1-3. Each kanban may include an E-card that stores the kanban capacity value K(Z) and a current WIP level (WIP(Z)). In operation, controller 104 may copy K(Z) values 114 stored in storage 112 to kanbans associated with different Q-zones. Further, controller 104 may monitor WIP(Z) level to determine when to supply WIPs to a Q-zone.

Figure 2:
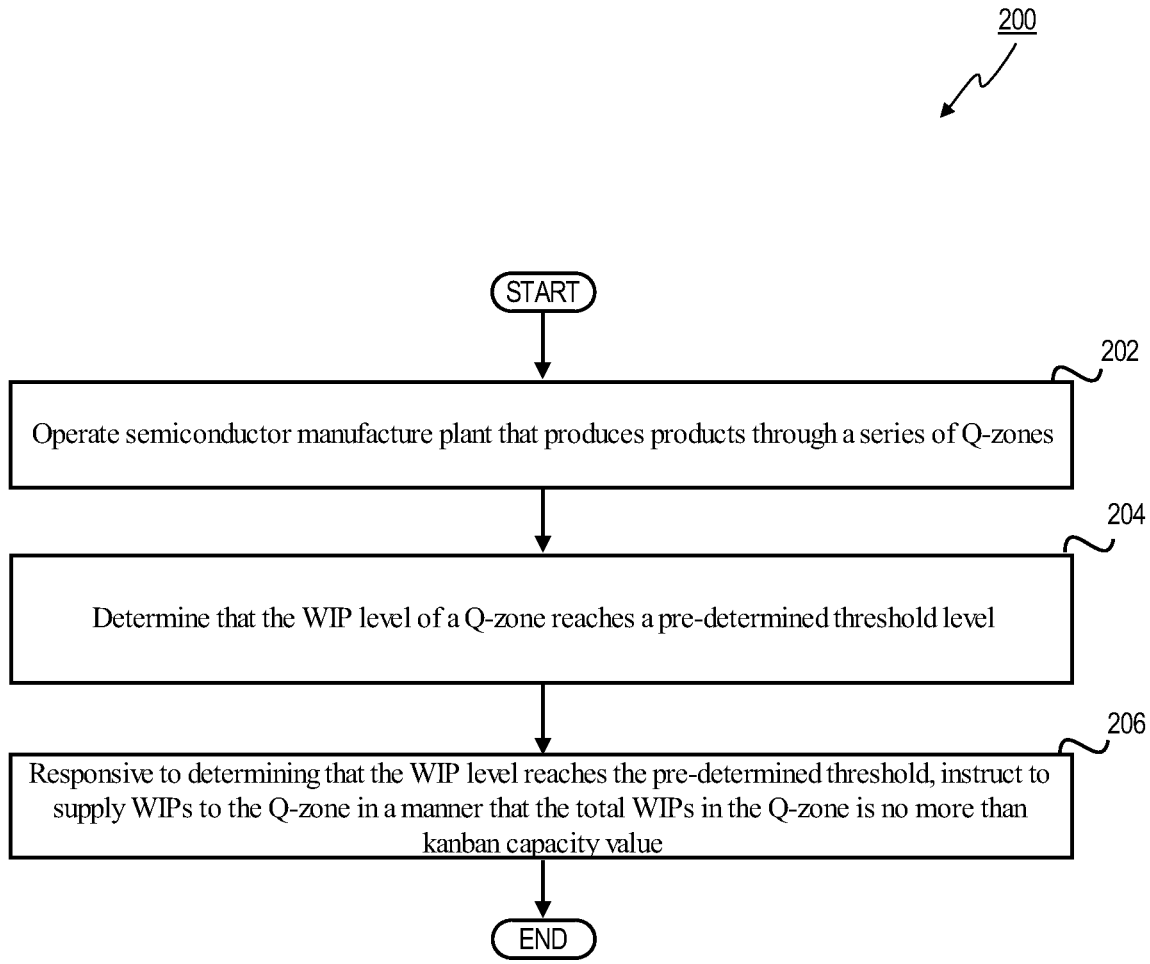
FIG. 2 depicts a flow diagram of a method to operate a semiconductor manufacture plant using kanbans according to an implementation of the disclosure.

FIG. 2 depicts a flow diagram of a method 200 to operate a semiconductor manufacture plant using kanbans according to an implementation of the disclosure. Method 200 may be performed by processing devices that may comprise hardware (e.g., circuitry, dedicated logic), computer readable instructions (e.g., run on a general purpose computer system or a dedicated machine), or a combination of both. Method 200 and each of its individual functions, routines, subroutines, or operations may be performed by one or more processors of the computer device executing the method. In certain implementations, method 200 may be performed by a single processing thread. Alternatively, method 200 may be performed by two or more processing threads, each thread executing one or more individual functions, routines, subroutines, or operations of the method.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be needed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 200 may be performed by a processing device 102 executing the controller 104 as shown in FIG. 1.

Referring to FIG. 2, at 202, controller 104 may operate a semiconductor manufacture plant (FAB) 100 that produces IC products through manufacture processes. Each manufacture process may be composed of hundreds of steps and sub-steps. These steps and sub-steps may be grouped into Q-zones. Each Q-zone may be associated with a Q-time constraint and a certain amount of WIPs that are processed by machines associated with the Q-zone through the steps of the Q-zone. Controller 104 may assign a kanban to a corresponding Q-zone. The kanban can be a data storage device (e.g., an E-card) or a physical card that stores data values including a WIP level value WIP(Z) and a Kanban capacity value K(Z), where the WIP(Z) may indicate the number of WIPs in the Q-zone and K(Z) may indicate the maximum number of WIPs that the Q-zone can hold.

As machines in the Q-zone complete the process of WIPs and ship them out of Q-zone(Z), WIP(Z) in the kanban representing the number of WIPs in the Q-zone may decrease. At 204, controller 104 may determine that the WIP(Z) for the Q-zone may reach a pre-determined threshold level which may indicate that WIPs are too low and needs restocking. In one implementation, WIP(Z)<K(Z) is the threshold level when WIPs are too low.

At 206, responsive to determining that the WIP level indicated by the kanban reaches the pre-determined threshold value, controller 104 may trigger a workflow to supply WIPs to the Q-zone. The supply may come from a prior step. The number of WIPs supplied to the Q-zone is limited so as to the total number WIPs in the Q-zone after the supply is no more than the kanban capacity value K(Z). As such, controller 104 may control the supply of WIPs in different Q-zones using the kanbans associated with these Q-zones.

Figure 3:
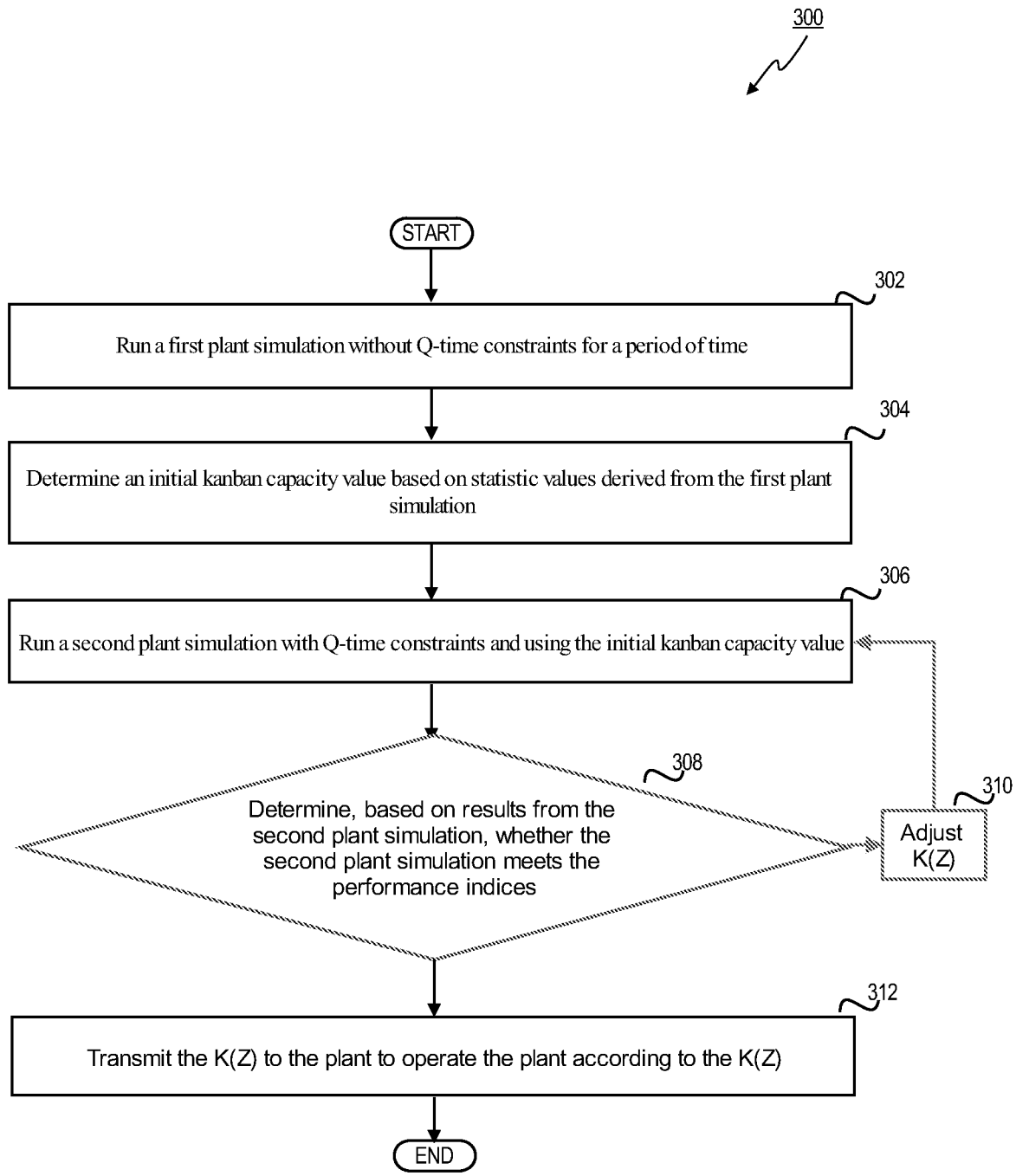
FIG. 3 depicts a flow diagram of a method to determine the kanban capacity value associated with a Q-zone according to an implementation of the disclosure.

The optimal kanban capacity value associated with a Q-zone may be determined through a computer simulation. FIG. 3 depicts a flow diagram of a method 300 to determine the kanban capacity value associated with a Q-zone according to an implementation of the disclosure.

In one implementation, method 300 may be performed by a processing device 402 as shown in FIG. 4.

Referring to FIG. 3, at 302, the processing device may run, without imposing Q-time constraints for Q-zones, a simulation of the operation of the semiconductor manufacture plant for a period of time. The simulation may include simulation of machines (or groups of machines) to process wafers (or wafer lots) through different steps. The processing device can remove the Q-time requirement by temporarily setting the Q-time to infinity for all Q-zones. Since the Q-time requirements are removed, the system may produce an ideal performance of the plant without taking into consideration Q-time requirements. If the system includes any scheduling policy or wafer-start plans to maximize the throughout, minimize the cycle time, or any other goals, the processing device may use the policy. If the simulation shows any WIP increase at some steps in the plant, then certain scheduling or reducing wafer-start may be used to decrease the excessive WIP at these steps. If the simulation shows any WIP decrease at some steps in the plant, then certain scheduling or increasing wafer-start may be used to increase the WIP at these steps. The process is repeated until the plants reaches a steady-state, i.e., no WIP increase or decrease.

At 304, the system may use the steady-state simulation results obtained from 302 to compute the following statistics on each Q-zone $Z_i$:

$N_i$=the average number of WIPs (e.g., wafers or wafer lots) finished in Q-zone $Z_i$ every day (lots/day); and $T_i$=the average time (excluding waiting time) that a WIP needs to finish in Q-zone $Z_i$ (day).

Then for each Q-zone $Z_i$, the processing device may set its initial kanban capacity $K_i$ to be between an upper bound (right-hand side) and a lower bound (left-hand-side) as:

$(T_i)*(N_i)<=K_i<=(Q\text{-time requirement of } Q\text{-zone } Z_i)*(N_i)$.

If $K_i$ is set below the lower bound, then throughput is lower than the ideal value which is $N_i$. If $K_i$ is set above the upper bound, then there may be Q-time violations. The processing device may make certain adjustments based on these guidelines. In one implementation, instead of using the Q-time requirement of Q-zone, the sum, over all steps of $Z_i$ of the assigned Q-time for each step obtained as described above using the assignment program.

At 306, the processing device may run the simulation again, with the original Q-time requirements restored and the initial kanban capacity $K_i$ computed at 304. The simulation may generate a second simulation result.

At 308, the processing device may check the second simulation result, generated at 306, to determine whether the performance indices, such as the number of Q-time violations and the number of wafers processed (also called moves), meet performance targets for each Q-zone. If not, the processing device may go to 310 to adjust the kanban capacity value for the Q-zone. If the violation-move indices are satisfied for all Q-zones, or if a good compromise is achieved, at 312, then the kanban capacity value K(Z) for all Q-zones are sent to the semiconductor plant to be used in the control of the plant.

At 310, the processing device may further adjust the kanban capacity value for each Q-zone. In one implementation, the more violations, the processing device may adjust the kanban capacity values to be lower. On the other hand, the fewer Q-time violations, the higher the kanban capacity values may be adjusted. All Q-zones that are related through shared machines maybe adjusted together. For a set of related Q-zones, the system may either increase all their kanban capacity values together or decrease all their kanban capacity values together. After the kanban capacity values are adjusted, the processing device may go back to 306 to re-run the simulation.

When adjusting the kanban capacity, the processing device may increase or decrease all Q-zones going through the same machines or machine group in a coordinated way. Because the Q-zones going through the same machines or machine group competes for the same machine or machine group, therefore changing the kanban capacity for some Q-zones may destroy the balance among the Q-zones. In one implementation, let Q-zones $Z_1, Z_2, \ldots, Z_n$ all going through the same machine or machine group. These Q-zones may be from different products and/or same product. Assume that the lower bounds for the Q-zones are denoted as $L_1, L_2, L_n$, respectively. Then when the kanban capacity is adjusted, only a scale r is increased or decreased while the kanban capacity values are derived as $K_1=r*L_1, K_2=r*L_2, \ldots, K_n=r*L_n$. In one implementation, the upper bounds for the Q-zone $U_1, U_2, \ldots, U_n$ may be used as the reference and the kanban capacity values are derived from r by $K_1=r*U_1, K_2=r*U_2, \ldots, K_n=r*U_n$. In one implementation, the adjustment is carried out by choosing r such that kanban capacity values are derived from r by $K'_1=r*K_1, K'_2=r*K_2, \ldots, K'_n=r*K_n$, where $K_1, K_2, \ldots, K_n$ may be kanban capacity values obtained through previous steps. In one implementation, the adjustment is done by correlated relation, not necessarily by linear relation.

The kanban capacity values for all Q-zones may be computed as often as needed, or according to a schedule (e.g., at a fixed time interval such as every day, week, or month). In general, when the manufacturing plant conditions change, such as the WIP change, new products start, or machines fail/repaired, the kanban capacity value needs to be re-calculated.

Implementations of the present disclosure provide a technical solution that includes a system and method to control the maximum numbers of wafers waiting to be processed (WIPs) at different steps to achieve the overall optimal utilization rate for the semiconductor manufacture plant, while at the same time, satisfy the Q-time requirements.

The disclosed method uses a hardware processor ("controller") to simulate the operation of the semiconductor plants. The simulator reports the number of Q-time violations and the number of moves, for each Q-zone, among other statistics.

Implementations of the present disclosure may include a controller as part of MES (Manufacturing Execution System) to control the WIPs at different locations while wafers (or wafer lots) are moving through the manufacturing plant. To this end, the controller may issue instructions to machines to select certain wafer or wafer lots to process, in order to satisfy the kanban capacity value.

The simulation can be a discrete-event driven computer simulation, in which discrete events are fed into a computer model to generate the outcome. In this application, the events can be WIPs delivered to a block at a particular time, the model may include the groups of machines (and their capacities) applied to different blocks, and the outcome is the WIPs distributed at different blocks through the manufacture process. In one implementation, the events may be derived first based on operator experience. These events are WIP allocation moves between different blocks. Then, the computer simulation is performed to determine the instructions including WIP allocation moves that may ensure WIPs at different Q-zones to satisfy the kanban requirement. The simulation may adjust the model (i.e., the instructions issued to different machines) to enable an optimal match between the WIPs at different Q-zones and the kanban through the manufacture process.

FIG. 4 depicts a block diagram of a computer system operating in accordance with one or more aspects of the present disclosure. In various illustrative examples, computer system 400 may correspond to a computing device within MES.

In certain implementations, computer system 400 may be connected (e.g., via a network, such as a Local Area Network (LAN), an intranet, an extranet, or the Internet) to other computer systems. Computer system 400 may operate in the capacity of a server or a client computer in a client-server environment, or as a peer computer in a peer-to-peer or distributed network environment. Computer system 400 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 400 may include a processing device 402, a volatile memory 404 (e.g., random access memory (RAM)), a non-volatile memory 406 (e.g., read-only memory (ROM) or electrically-erasable programmable ROM (EEPROM)), and a data storage device 416, which may communicate with each other via a bus 408.

Processing device 402 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 400 may further include a network interface device 422. Computer system 400 also may include a video display unit 410 (e.g., an LCD), an alphanumeric input device 412 (e.g., a keyboard), a cursor control device 414 (e.g., a mouse), and a signal generation device 420.

Data storage device 416 may include a non-transitory computer-readable storage medium 424 on which may store instructions 426 encoding any one or more of the methods or functions described herein, including instructions the simulation method as described in FIG. 3.

Instructions 426 may also reside, completely or partially, within volatile memory 404 and/or within processing device 402 during execution thereof by computer system 400, hence, volatile memory 404 and processing device 402 may also constitute machine-readable storage media.

While computer-readable storage medium 424 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "associating," "determining," "updating" or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may comprise a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform method 400 and/or each of its individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
executing, by a processing device, a first simulation of operations of a semiconductor manufacture plant without imposing a Q-time constraint on a Q-zone, wherein the Q-zone comprises a plurality of manufacture steps to process a plurality of work-in-processes (WIPs) under the Q-time constraint;
determining a kanban capacity value associated with the Q-zone based on results from the first simulation;
executing a second simulation of operations of the semiconductor manufacture plant using the kanban capacity value under the Q-time constraint;
determining whether results of the second plant simulation meet performance indices; and
responsive to determining that the results of the second simulation meet the performance indices, providing the kanban capacity value to a manufacture execution system to operate the semiconductor manufacture plant using the kanban capacity value.

2. The method of claim 1, further comprising:
responsive to determining that the results of the second plant simulation fail to meet the performance indices, adjusting the kanban capacity value;
executing a third simulation of operations of the semiconductor manufacture plant using the adjusted kanban capacity value under the Q-time constraint; and
determining whether results of the third simulation meet the performance indices.

3. The method of claim 2, further comprising:
responsive to determining that the results of the third simulation meet the performance indices, providing the adjusted kanban capacity value to the manufacture execution system to operate the semiconductor manufacture plant using the adjusted kanban capacity value; and
responsive to determining that the results of the third simulation fail to meet the performance indices, further adjusting the adjusted kanban capacity value.

4. The method of claim 1, wherein the operations of the semiconductor manufacture plant comprise a manufacture process comprising a plurality of Q-zones, wherein each of the plurality of the Q-zones comprises a plurality of manufacture steps to process a plurality of WIPs using a plurality of machines, and wherein each Q-zone is assigned a corresponding Q-time constraint.

5. The method of claim 4, wherein each one of the plurality of Q-zone is associated with a corresponding kanban comprising a WIP level value indicating a number of WIPs in the Q-zone and a kanban capacity value indicating a maximum number of WIPs that are allowed in the Q-zone.

6. The method of claim 1, wherein determining the kanban capacity value associated with the Q-zone based on results from the first simulation comprises:
calculating a plurality of statistics values of the results from the first simulation; and
determining the kanban capacity value based on the plurality of statistics values.

7. The method of claim 6, wherein the plurality of statistics values comprise at least one of an average number of WIPs finished in the Q-zone over a pre-determined time period and an average time that a WIP needs to finish in the Q-zone.

8. The method of claim 7, wherein determining the kanban capacity value associated with the Q-zone based on results from the first simulation comprises selecting a value between a lower bound and an upper bound, wherein the lower bound is a multiplication of the average number of WIPs finished in the Q-zone over the pre-determined time period and the average time that a WIP needs to finish in the Q-zone, and wherein the upper bound is a multiplication of the average number of WIPs finished in the Q-zone over the pre-determined time period and the Q-time associated with the Q-zone.

9. The method of claim 7, wherein the Q-zone further comprises one or more nested Q-zones, wherein determining the kanban capacity value associated with the Q-zone based on results from the first simulation comprises determining an upper bound using a linear programming solver subject to a constraint that a maximum value of a sum of all estimated times for all steps in the one or more nested Q-zones is no more than the Q-time.

10. The method of claim 4, wherein adjusting the kanban capacity value comprises one of increasing or decreasing kanban capacity values associated with the plurality of Q-zone together.

11. The method of claim 4, wherein adjusting the kanban capacity value comprises one of increasing or decreasing kanban capacity values of Q-zones related by one machine until the WIP in the Q-zone reaches a steady state.

12. The method of claim 11, wherein adjusting the kanban capacity value comprises adjusting a ratio applied to all of the kanban capacity values of the Q-zones related by one machine.

13. The method of claim 1, wherein the performance indices comprise at least one a number of Q-time violations or a number of WIPs processed in the Q-zone, wherein the WIPs comprise at least one a wafer or a wafer lot, and wherein the WIP is maintained for one of a product or a group of products.

14. The method of claim 1, further comprising:
determining a set of Q-zones that contain identical steps; and
adjusting kanban capacity value of the set of Q-zones concurrently.

15. A non-transitory machine-readable storage medium storing instructions which, when executed, cause a processing device to:
execute a first simulation of operations of a semiconductor manufacture plant without imposing a Q-time constraint on a Q-zone, wherein the Q-zone comprises a plurality of manufacture steps to process a plurality of work-in-processes (WIPs) under the Q-time constraint;
determine a kanban capacity value associated with the Q-zone based on results from the first simulation;
execute a second simulation of operations of the semiconductor manufacture plant using the kanban capacity value under the Q-time constraint;
determine whether results of the second plant simulation meet performance indices; and responsive to determining that the results of the second simulation meet the performance indices, provide the kanban capacity value to a manufacture execution system to operate the semiconductor manufacture plant using the kanban capacity value.

16. The non-transitory machine-readable storage medium of claim 15, wherein the processing device is further to:
responsive to determining that the results of the second plant simulation fail to meet the performance indices, adjust the kanban capacity value;
execute a third simulation of operations of the semiconductor manufacture plant using the adjusted kanban capacity value under the Q-time constraint;
determine whether results of the third simulation meet the performance indices;
responsive to determining that the results of the third simulation meet the performance indices, provide the adjusted Kanban capacity value to the manufacture execution system to operate the semiconductor manufacture plant using the adjusted kanban capacity value; and
responsive to determining that the results of the third simulation fail to meet the performance indices, further adjust the adjusted kanban capacity value.

17. The non-transitory machine-readable storage medium of claim 15, wherein the operations of the semiconductor manufacture plant comprise a manufacture process comprising a plurality of Q-zones, wherein each of the plurality of the Q-zones comprises a plurality of manufacture steps to process a plurality of WIPs using a plurality of machines, and wherein each Q-zone is assigned a corresponding Q-time constraint, and wherein each one of the plurality of Q-zone is associated with a corresponding kanban comprising a WIP level value indicating a number of WIPs in the Q-zone and a kanban capacity value indicating a maximum number of WIPs that are allowed in the Q-zone.

18. The non-transitory machine-readable storage medium of claim 15, wherein the processing device is further to:
calculate a plurality of statistics values of the results from the first simulation; and
determine the kanban capacity value based on the plurality of statistics values.

19. A system, comprising:
a memory; and
a processing device, communicatively coupled to the memory to:
execute, by the processing device, a first simulation of operations of a semiconductor manufacture plant without imposing a Q-time constraint on a Q-zone, wherein the Q-zone comprises a plurality of manufacture steps to process a plurality of work-in-processes (WIPs) under the Q-time constraint;
determine a kanban capacity value associated with the Q-zone based on results from the first simulation;
execute a second simulation of operations of the semiconductor manufacture plant using the kanban capacity value under the Q-time constraint;
determine whether results of the second plant simulation meet performance indices; and
responsive to determining that the results of the second simulation meet the performance indices, provide the kanban capacity value to a manufacture execution system to operate the semiconductor manufacture plant using the kanban capacity value.

20. The system of claim 19, wherein the processing device is further to:
responsive to determining that the results of the second plant simulation fail to meet the performance indices, adjust the kanban capacity value;
execute a third simulation of operations of the semiconductor manufacture plant using the adjusted kanban capacity value under the Q-time constraint; and
determine whether results of the third simulation meet the performance indices.

* * * * *